United States Patent
Saito (10) Patent No.: US 10,304,806 B2
(45) Date of Patent: May 28, 2019

(54) SEMICONDUCTOR DEVICE

(71) Applicant: PEZY Computing K.K., Tokyo (JP)

(72) Inventor: Motoaki Saito, Tokyo (JP)

(73) Assignee: PEZY COMPUTING K.K., Chiyoda-Ku, Tokyo (JP)

( * ) Notice: Subject to any disclaimer, the term of this patent is extended or adjusted under 35 U.S.C. 154(b) by 0 days.

(21) Appl. No.: 15/744,772

(22) PCT Filed: Jul. 16, 2015

(86) PCT No.: PCT/JP2015/070451
§ 371 (c)(1),
(2) Date: Jan. 13, 2018

(87) PCT Pub. No.: WO2017/010012
PCT Pub. Date: Jan. 19, 2017

(65) Prior Publication Data
US 2018/0240784 A1    Aug. 23, 2018

(51) Int. Cl.
*H01L 25/065* (2006.01)
*H01L 21/822* (2006.01)
(Continued)

(52) U.S. Cl.
CPC ........ *H01L 25/0657* (2013.01); *H01L 21/822* (2013.01); *H01L 23/5227* (2013.01);
(Continued)

(58) Field of Classification Search
CPC . H01L 23/5227; H01L 25/0657; H01L 28/10; H01L 2225/06531
See application file for complete search history.

(56) References Cited

U.S. PATENT DOCUMENTS 6,396,712 B1 * 5/2002 Kuijk ............... H01L 23/48
257/777
8,004,054 B2   8/2011 Nakashiba
(Continued)

FOREIGN PATENT DOCUMENTS

EP          1638274 A    3/2006
JP     2006-114028 A    4/2006
(Continued)

OTHER PUBLICATIONS

Y. Take et al., "3D NoC with Inductive-Coupling Links for Building-Block SiPs", IEEE Transactions on Computers, 2014, pp. 748-763, vol. 63, No. 3.

*Primary Examiner* — Allan R Wilson
(74) *Attorney, Agent, or Firm* — Muncy, Geissler, Olds & Lowe, PC (57) ABSTRACT

A semiconductor device includes multiple semiconductor chips and a control unit. Each of the semiconductor chips has multiple signal processing units that can be connected with each other, multiple in-chip signal lines that are respectively connected to the signal processing units and that can be connected with each other, and a connection-state changing unit that changes the connection state between the in-chip signal lines according to an instruction from the control unit. The connection-state changing unit of each semiconductor chip changes the connection state between the in-chip signal lines according to the instruction from the control unit, so that the connection state between the signal processing units is changed.

9 Claims, 4 Drawing Sheets

(51) Int. Cl.
*H01L 25/18* (2006.01)
*H01L 27/04* (2006.01)
*H01L 23/522* (2006.01)
*H01L 49/02* (2006.01)

(52) U.S. Cl.
CPC ............ *H01L 25/065* (2013.01); *H01L 25/18* (2013.01); *H01L 27/04* (2013.01); *H01L 28/10* (2013.01); *H01L 2225/06531* (2013.01)

(56) References Cited

U.S. PATENT DOCUMENTS

| | | | |
|---|---|---|---|
| 8,125,059 | B2 | 2/2012 | Ito et al. |
| 8,391,040 | B2 | 3/2013 | Suzuki et al. |
| 8,401,492 | B2 | 3/2013 | Uejima et al. |
| 8,744,349 | B2 | 6/2014 | Kuroda |
| 9,990,979 | B2 * | 6/2018 | Park ........................ G11C 5/145 |
| 2006/0001176 | A1 | 1/2006 | Fukaishi et al. |
| 2007/0001270 | A1 | 1/2007 | Sukegawa et al. |
| 2009/0140359 | A1 | 6/2009 | Nakashiba |
| 2009/0189745 | A1 | 7/2009 | Nakashiba |
| 2010/0052096 | A1 | 3/2010 | Urakawa |
| 2010/0109133 | A1 | 5/2010 | Ito et al. |
| 2010/0144063 | A1 | 6/2010 | Furumiya et al. |
| 2010/0230782 | A1 | 9/2010 | Uchida et al. |
| 2010/0304693 | A1 | 12/2010 | Uejima et al. |
| 2010/0321054 | A1 * | 12/2010 | Kameda ............. G01R 31/3025 324/754.07 |
| 2011/0050357 | A1 | 3/2011 | Kim et al. |
| 2011/0102015 | A1 | 5/2011 | Kuroda |
| 2011/0242870 | A1 | 10/2011 | Oh |
| 2011/0260747 | A1 * | 10/2011 | Kameda ............. G01R 31/2884 324/762.01 |
| 2011/0267864 | A1 * | 11/2011 | Suzuki ..................... G11C 5/02 365/51 |
| 2012/0020419 | A1 | 1/2012 | Kaeriyama |
| 2012/0217658 | A1 | 8/2012 | Kuroda |
| 2014/0021575 | A1 | 1/2014 | Ishihara et al. |
| 2014/0143441 | A1 | 5/2014 | Seo |
| 2014/0323046 | A1 * | 10/2014 | Asai ..................... H01Q 1/2283 455/41.2 |
| 2014/0374890 | A1 | 12/2014 | Yamashita et al. |
| 2015/0137314 | A1 | 5/2015 | Osada et al. |
| 2016/0027732 | A1 | 1/2016 | Igarashi et al. |
| 2017/0098469 | A1 * | 4/2017 | Park ........................ G11C 5/145 |
| 2018/0061662 | A1 * | 3/2018 | Funaya ............... H01L 27/0688 |
| 2018/0226379 | A1 * | 8/2018 | Saito ................... H01L 21/822 |

FOREIGN PATENT DOCUMENTS

| | | |
|---|---|---|
| JP | 2009141011 A | 6/2009 |
| JP | 2010109112 A | 5/2010 |
| JP | 2011086738 A | 4/2011 |
| JP | 2011097557 A | 5/2011 |
| JP | 2011204821 | 10/2011 |
| JP | 2011233842 A | 11/2011 |

* cited by examiner

SEMICONDUCTOR DEVICE

TECHNICAL FIELD

The present invention relates to a semiconductor device having a non-contact communication unit.

Conventionally, a semiconductor device that has non-contact communication units is known (refer to Patent Document 1). The semiconductor device of Patent Document 1 includes two integrated circuits (101-1 and 101-2) and router chips (102-1 and 102-2) separated from the two integrated circuits. Non-contact communication interface circuits 113 provided in the router chips (102-1 and 102-2) are used for communication between the two integrated circuits.

Patent Document 1: Japanese Unexamined Patent Application, Publication No. 2011-204821.

DISCLOSURE OF THE INVENTION

Problems to be Solved by the Invention

However, the semiconductor device preferably has a configuration in which miniaturization or integration is easy. A configuration of the semiconductor device of Patent Document 1 is a configuration in which the communication between the integrated circuits is performed by the router chips separated from the integrated circuits. Therefore, the semiconductor device of Patent Document 1 does not have a configuration in which miniaturization and integration are easy.

It is an object of the present invention to provide a semiconductor device with a configuration that facilitates miniaturization or integration.

(1) The present invention relates to a semiconductor device. The semiconductor device includes a plurality of semiconductor chips and a control unit which are layered,
wherein each of the semiconductor chips has:
a plurality of signal processing unit that can be connected with each other;
a plurality of in-chip signal lines that are respectively connected to the plurality of signal processing units and that can be connected with each other;
a connection-state changing unit that changes the connection state between the plurality of in-chip signal lines according to an instruction from the control unit; and
a plurality of non-contact communication units that are respectively connected to the plurality of in-chip signal lines,
wherein each of the non-contact communication units of each of the semiconductor chips communicates with the non-contact communication unit of one or more other semiconductor chips in a non-contact manner in a layering direction, and
wherein the connection-state changing unit of each semiconductor chip changes the connection state between the plurality of in-chip signal lines according to the instruction from the control unit, so that the connection state between the plurality of signal processing units is changed.

(2) One of the non-contact communication units of any given semiconductor chip may communicate, in a non-contact manner in the layering direction, with a non-contact communication unit of another semiconductor chip adjacent in the layering direction, the one of the non-contact communication units of the any given semiconductor chip being disposed to overlap in the layering direction with the non-contact communication unit of the another semiconductor chip.

(3) One of the non-contact communication units of any given semiconductor chip may communicate, in a non-contact manner in the layering direction, with a non-contact communication unit of another semiconductor chip that is not adjacent in the layering direction, the one of the non-contact communication units of the any given semiconductor chip being disposed to overlap in the layering direction with the non-contact communication unit of the another semiconductor chip.

(4) One of the non-contact communication units of any given semiconductor chip and one of the non-contact communication units of at least another semiconductor chip adjacent in the layering direction may not overlap each other in the layering direction.

(5) In the semiconductor chip, one of the non-contact communication units may be arranged to overlap any one of the connection-state changing unit and the signal processing unit in the layering direction.

(6) The non-contact communication unit may be a coil.

(7) One of the non-contact communication units of any given semiconductor chip may be an adjacent communication non-contact communication coil that communicates, in a non-contact manner in the layering direction, with a non-contact communication unit of another semiconductor chip adjacent in the layering direction, the one of the non-contact communication units of the any given semiconductor chip being disposed to overlap in the layering direction with the non-contact communication unit of the another semiconductor chip,
another of the non-contact communication units of any given semiconductor chip may be a non-adjacent communication non-contact communication coil that communicates, in a non-contact manner in the layering direction, with a non-contact communication unit of another semiconductor chip that is not adjacent in the layering direction, the one of the non-contact communication units of the any given semiconductor chip being disposed to overlap in the layering direction with the non-contact communication unit of the another semiconductor chip, and
a magnetic flux density formed by the adjacent communication non-contact communication coil may be smaller than the magnetic flux density formed by the non-adjacent communication non-contact communication coil.

According to the present invention, it is possible to provide a semiconductor device with a configuration that facilitates miniaturization and integration.

FIGS. 5A to 5C are exploded perspective views explaining non-contact communication in the semiconductor device according to the embodiment of the present invention, in which

Figure 1:
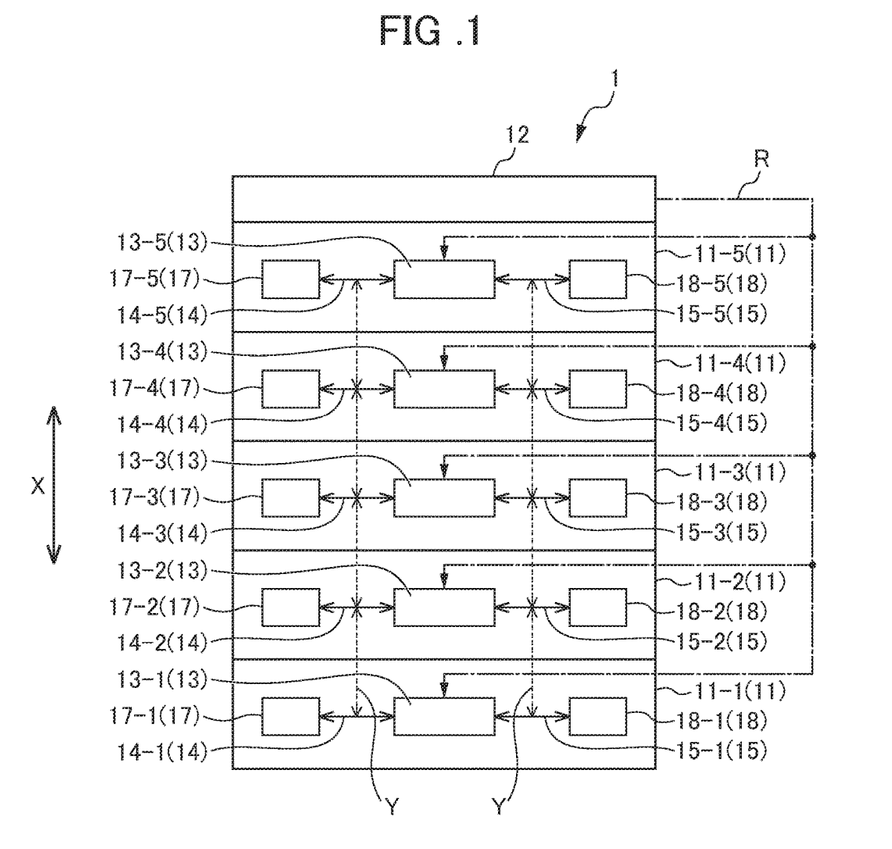
FIG. 1 is a schematic cross-sectional view explaining a configuration of the semiconductor device according to an embodiment of the present invention.
Figure 2:
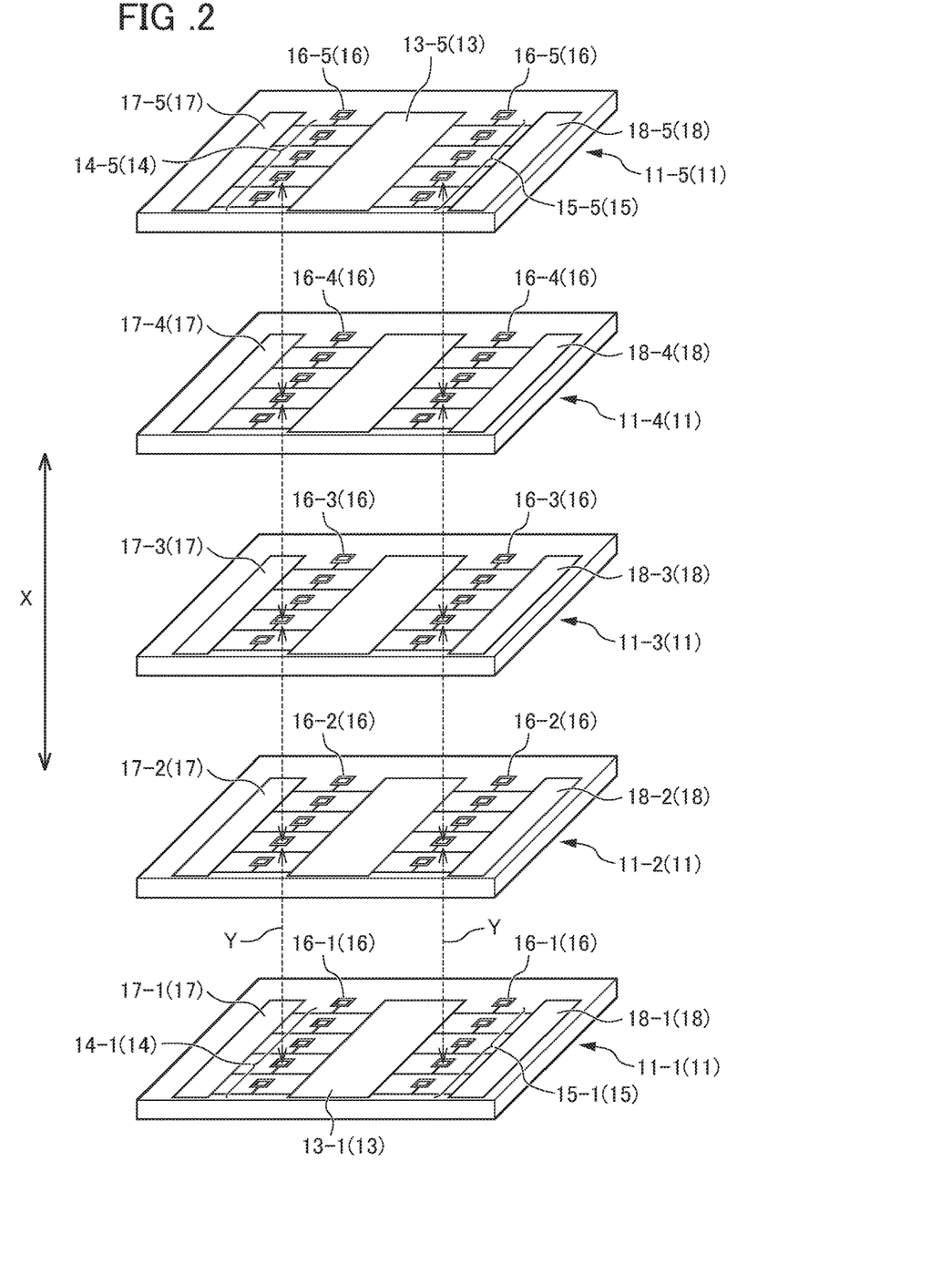
FIG. 2 is an exploded perspective view explaining the configuration of the semiconductor device according to the embodiment of the present invention.

Hereinafter, an embodiment of the present invention will be described with reference to the drawings. FIG. 1 is a schematic cross-sectional view explaining a configuration of the semiconductor device according to an embodiment of the present invention. FIG. 2 is an exploded perspective view explaining the configuration of the semiconductor device according to the embodiment of the present invention.

In the following description, "performing communication in a non-contact manner" means that one communication unit performing the communication and another communication unit performing the communication perform the communication without contacting each other and using a conductive member (at least one of solder, a conductive adhesive, and a wire). In addition, "performing the communication in a contact manner" means that one communication unit performing the communication and a communication unit performing the communication perform the communication while contacting each other or perform the communication using a conductive member (at least one of a solder, a conductive adhesive, and a wire). In addition, the communication unit is a concept including a unit performing transmission and reception, a unit performing only the transmission, and a unit performing only the reception.

As shown in FIG. 1, the semiconductor device 1 includes five (a plurality of) semiconductor chips 11 and a control chip 12 functioning as a control unit. The five (the plurality of) semiconductor chips 11 include a first semiconductor chip 11-1, a second semiconductor chip 11-2, a third semiconductor chip 11-3, a fourth semiconductor chip 11-4, and a fifth semiconductor chip 11-5. The first semiconductor chip 11-1 to the fifth semiconductor chip 11-5 are bonded to each other by fusion bonding and are layered. In addition, the control chip 12 is bonded to an upper part of the fifth semiconductor chip 11-5 by the fusion bonding and is layered on the fifth semiconductor chip 11-5.

As shown in FIGS. 1 and 2, the first semiconductor chip 11-1 has a first switch circuit 13-1 functioning as a connection-state changing unit, first input-side signal lines 14-1 functioning as in-chip signal lines, first output-side signal lines 15-1 functioning as in-chip signal lines, first non-contact communication coils 16-1 functioning as non-contact communication units, a calculation unit 17-1 functioning as a signal processing unit, and a memory unit 18-1 functioning as a signal processing unit. Likewise, the second semiconductor chip 11-2 to the fifth semiconductor chip 11-5 each have a second switch circuit 13-2 to a fifth switch circuit 13-5 (connection-state changing units), second input-side signal lines 14-2 to fifth input-side signal lines 14-5 (in-chip signal lines), second output-side signal lines 15-2 to fifth output-side signal lines 15-5 (in-chip signal lines), second non-contact communication coils 16-2 to fifth non-contact communication coils 16-5 (non-contact communication units), a second calculation unit 17-2 to a fifth calculation unit 17-5 (signal processing unit), and a second memory unit 18-2 to a fifth memory unit 18-5 (signal processing unit). As such, the semiconductor chip 11 has switch circuits 13, input-side signal lines 14, output-side signal lines 15, non-contact communication coils 16, calculation units 17, and memory units 18.

The operation units 17 are composed of a plurality of operation processing devices (not shown in the drawings). Each of the operation processing devices is, for example, a processor. The memory units 18 are composed of a plurality of memory devices (not shown in the drawings). Each of the plurality of memory devices is, for example, a cache memory.

The semiconductor device 1 is electrically connected to a terminal of a circuit board (not shown in the drawings) provided in an electric apparatus or the like and exerts a predetermined function in an electronic apparatus or the like. For example, the semiconductor device 1 may be a multi-core processor that includes a plurality of processors, cache memories corresponding to these processors, and the like. The multi-core processor may be, for example, an MIMD-type multi-core processor.

As shown in FIG. 2, the five (the plurality of) first input-side signal lines 14-1 are provided in the first semiconductor chip 11-1. One end of each of the five first input-side signal lines 14-1 is connected to the first switch circuit 13-1. The other end of each of the five (the plurality of) first input-side signal lines 14-1 is connected to the first calculation unit 17-1.

Likewise, in the second semiconductor chip 11-2 to the fifth semiconductor chip 11-5, one ends of the second input-side signal line 14-2 to the fifth input-side signal line 14-5 are connected to the second switch circuit 13-2 to the fifth switch circuit 13-5, respectively. The other ends of the second input-side signal line 14-2 to the fifth input-side signal line 14-5 are connected to the second calculation unit 17-2 and the fifth calculation unit 17-5, respectively.

The five (the plurality of) first output-side signal lines 15-1 are provided in the first semiconductor chip 11-1. One ends of the five first output-side signal lines 15-1 are connected to the first switch circuit 13-1. The other ends of the five first output-side signal lines 15-1 are connected to the first memory unit 18-1.

Likewise, in the second semiconductor chip 11-2 to the fifth semiconductor chip 11-5, one ends of the second output-side signal line 15-2 to the fifth output-side signal line 15-5 are connected to the second switch circuit 13-2 to the fifth switch circuit 13-5, respectively. The other ends of the second output-side signal line 15-2 to the fifth output-side signal line 15-5 are connected to the second memory unit 18-2 to the fifth memory unit 18-5, respectively.

As shown in FIG. 2, the ten (the plurality of) first non-contact communication coils 16-1 to the ten (the plurality of) fifth non-contact communication coils 16-5 are provided in the first semiconductor chip 11-1 to the fifth semiconductor chip 11-5, respectively. In FIG. 2, an illustration of the control chip 12 is omitted. Each of the first non-contact communication coils 16-1 is connected to either the first input-side signal line 14-1 or the first output-side signal line 15-1. Each of the second non-contact communication coils 16-2 is connected to either the second input-side signal line 14-2 or the second output-side signal line 15-2. Each of the third non-contact communication coils 16-3 is connected to either the third input-side signal line 14-3 or the third output-side signal line 15-3. Each of the fourth non-contact communication coils 16-4 is connected to either the fourth input-side signal line 14-4 or the fourth output-side signal line 15-4. Each of the fifth non-contact communication coils 16-5 is connected to either the fifth input-side signal line 14-5 or the fifth output-side signal line 15-5.

As shown in FIG. 2, the first non-contact communication coil 16-1 to the fifth non-contact communication coil 16-5 are arranged to overlap each other in a layering direction X.

In the first non-contact communication coil 16-1 to the fifth non-contact communication coil 16-5, non-contact communication is enabled between the coils overlapping each other in the layering direction X. For example, the first non-contact communication coil 16-1 can communicate with the second non-contact communication coil 16-2 overlapping the first non-contact communication coil 16-1 in the layering direction X in a non-contact manner, as shown by the dotted arrows Y of FIGS. 1 and 2. Likewise, the first non-contact communication coil 16-1 to the fifth non-contact communication coil 16-5 can communicate with each other in a non-contact manner, as shown by the dotted arrows Y. From the different viewpoint, the first non-contact communication coil 16-1 to the fifth non-contact communication coil 16-5 can communicate with each other in a non-contact manner in an overlapping direction in the layering direction X by inductive coupling generated between the individual coils.

As shown in FIG. 1, the control chip 12 outputs an instruction signal R (one-dotted chain line R in FIG. 1) as an instruction to each of the first switch circuit 13-1 to the fifth switch circuit 13-5. The first switch circuit 13-1 changes the connection state between the first input-side signal line 14-1 and the first output-side signal line 15-1, on the basis of the instruction signal R from the control chip 12. Therefore, a signal input from each first input-side signal line 14-1 can be output from any first output-side signal line 15-1 via the first switch circuit 13-1. Each of the second switch circuit 13-2 to the fifth switch circuit 13-5 also performs the same operation on the basis of the instruction signal R from the control chip 12. Therefore, a signal input from each second input-side signal line 14-2 can be output from any second output-side signal line 15-2 via the second switch circuit 13-2. A signal input from each third input-side signal line 14-3 can be output from any third output-side signal line 15-3 via the third switch circuit 13-3. A signal input from each fourth input-side signal line 14-4 can be output from any fourth output-side signal line 15-4 via the fourth switch circuit 13-4. A signal input from each fifth input-side signal line 14-5 can be output from any fifth output-side signal line 15-5 via the fifth switch circuit 13-5.

Next, an operation of the semiconductor device 1 will be described with reference to FIGS. 1 and 2. Here, an example of an operation in the case where a signal S1 input from the first signal calculation unit 17-1 into the first input-side signal line 14-1 is output to the fifth memory unit 18-5 will be described.

The signal S1 input from the first calculation unit 17-1 into the first input-side signal line 14-1 is input to the fifth switch circuit 13-5 via the first input-side signal line 14-1, the first non-contact communication coil 16-1, the second non-contact communication coil 16-2, the third non-contact communication coil 16-3, the fourth non-contact communication coil 16-4, the fifth non-contact communication coil 16-5, and the fifth input-side signal line 14-5.

The fifth switch circuit 13-5 changes the connection state such that the fifth input-side signal line 14-5 to which the signal S1 is input and the fifth output-side signal line 15-5 according to the instruction signal R from the control chip 12. As a result, the signal S1 is output to the fifth memory unit 18-5 via the fifth output-side signal line 15-5.

In addition, the signal S1 input from the first calculation unit 17-1 into the first input-side signal line 14-1 can be output to the fifth memory unit 18-5 via the following path. For example, after the signal S1 input into the first input-side signal line 14-1 is output to the first output-side signal line 15-1 via the first switch circuit 13-1 in the first semiconductor chip 11-1, the signal S1 can be output to the fifth memory unit 18-5 via the first non-contact communication coil 16-1 to the fifth non-contact communication coil 16-5. In addition, after the signal S1 input into the first input-side signal line 14-1 is output to the second output-side signal line 15-2 via the first non-contact communication coil 16-1, the second non-contact communication coil 16-2, and the second switch circuit 13-2, the signal S1 can be output to the fifth memory unit 18-5 via the third non-contact communication coil 16-3 to the fifth non-contact communication coil 16-5.

In addition to the description given here, the signal S1 input from the first calculation unit 17-1 into the first input-side signal line 14-1 can be output to the fifth memory unit 18-5 via various paths (e.g., a path including the switch circuit 13, the input-side signal line 14, the output-side signal line 15, the non-contact communication coil 16, and the like). In addition, the signal S1 input into the first input-side signal line 14-1 can be output to any one of the first memory unit 18-1 to the fourth memory unit 18-4 via the various paths. Likewise, the signals input from the second calculation unit 17-2 to the fifth calculation unit 17-5 can be output from any one of the first memory unit 18-1 to the fifth memory unit 18-5 via various paths.

As such, the connection states between the first calculation unit 17-1 to the fifth calculation unit 17-5 and the first memory unit 18-1 to the fifth memory unit 18-5 are changed by the first switch circuit 13-1 to the fifth switch circuit 13-5. Therefore, the semiconductor device 1 efficiently causes a plurality of calculation units (the first calculation unit 17-1 to the fifth calculation unit 17-5) and the memory units (the first memory unit 18-1 to the fifth memory unit 18-5) to cooperate with each other, so that the semiconductor device 1 is made into a semiconductor device that realizes various functions, improvement in the processing speed, and the like.

The positions, numbers, shapes, and the like of the switch circuits 13, the non-contact communication coils 16, calculation units 17, and the memory units 18 in FIG. 2 are different from those in FIGS. 3 and 4 to be described later. This is because FIG. 2 is a diagram simplified to facilitate the description of the communication between the semiconductor chips 11 and is not a diagram showing actual positions, actual numbers, and the like of the switch circuits 13, the non-contact communication coils 16, calculation units 17, and the memory units 18.

Next, a structure of the semiconductor chip 11 (the first semiconductor chip 11-1 to the fifth semiconductor chip 11-5) will be described with reference to FIGS. 3 and 4.

Figure 3:
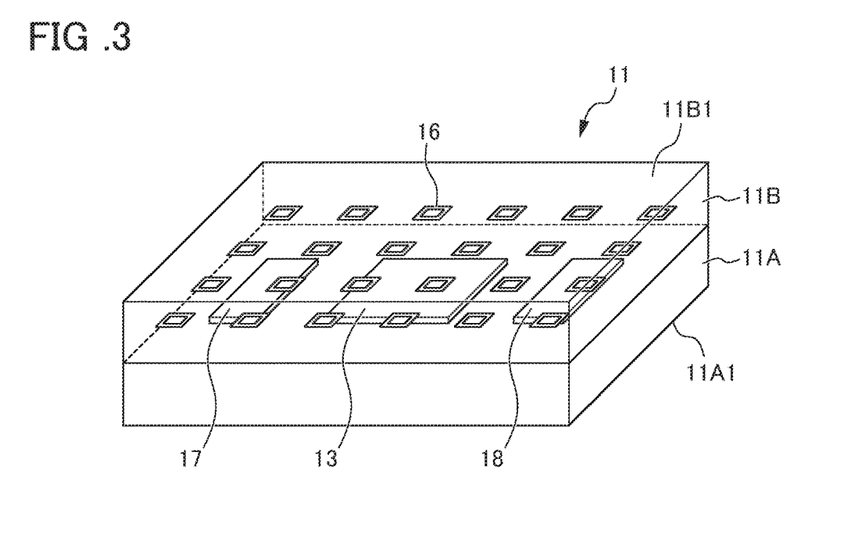
FIG. 3 is an internal transparent perspective view of a semiconductor chip according to the embodiment of the present invention.

As shown in FIG. 3, the semiconductor chip 11 includes a semiconductor substrate unit 11A and an insulating layer unit 11B. The switch circuit 13, calculation unit 17, and memory unit 18 are formed on the semiconductor substrate unit 11A. The insulating layer unit 11B is layered (disposed) on the semiconductor substrate unit 11A to cover the semiconductor substrate unit 11A, the switch circuit 13, the calculation unit 17, and the memory unit 18. The plurality of non-contact communication coils 16 functioning as the non-contact communication units are formed in the insulating layer unit 11B. Each of the non-contact communication coils 16 is connected to the input-side signal line 14 (not shown in the drawings) or the output-side signal line 15 (not shown in the drawings) in the insulating layer unit 11B. Some of the plurality of non-contact communication coils 16 are arranged to overlap the switch circuits 13 in the layering direction X. Therefore, the size of the region needed to arrange the non-contact communication coils 16 can be reduced.

Figure 5A:
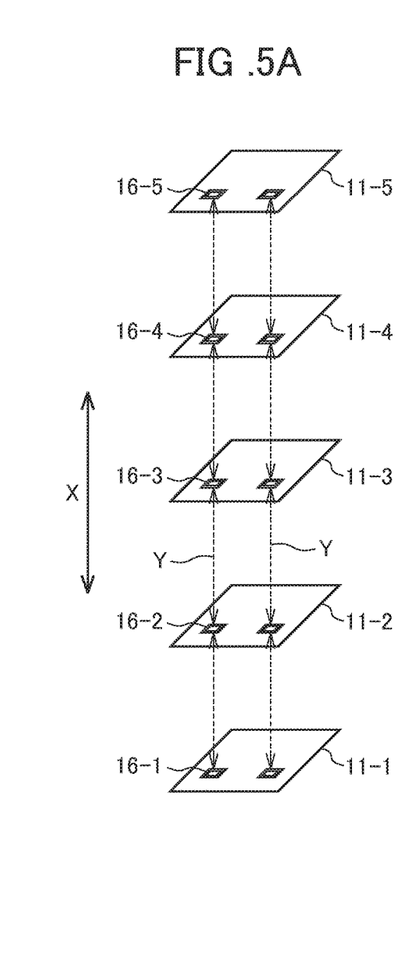
FIG. 5A is a diagram showing an aspect where the non-contact communication is performed between all semiconductor chips.

The semiconductor substrate unit 11A is a substrate that is made of silicon. The insulating layer unit 11B is made of silicon oxide. The semiconductor chip 11 has a semiconductor substrate unit principal surface 11A1 of the semiconductor substrate unit 11A on which the insulating layer unit 11B is not layered (disposed) and an insulating layer unit principal surface 11B1 being a surface of the insulating layer unit 11B. As shown in FIG. 5, the semiconductor substrate unit principal surface 11A1 of one semiconductor chip 11 and the insulating layer unit principal surface 11B1 of another semiconductor chip 11 adjacent to one semiconductor chip 11 in the layering direction are bonded by fusion bonding, so that the five semiconductor chips 11 are layered. As such, the five semiconductor chips 11 are directly bonded and are layered without gaps.

The semiconductor device 1 includes signal terminals (not shown in the drawings) that are electrically connected to terminals of a circuit board (not shown in the drawings) provided in an electric apparatus or the like. These signal terminals may be provided, for example, on the semiconductor substrate unit principal surface 11A1 of the first semiconductor chip 11-1 or the surface of the control chip 12. In this case, for example, the signal terminals are connected to the first switch circuit 13-1 to the fifth switch circuit 13-5 via penetration electrodes or non-contact communication coils, respectively. In addition, the signal terminals may be provided, for example, on the insulating layer unit principal surface 11B1 of the fifth semiconductor chip 11-5. In this case, for example, the signal terminals are connected to the first switch circuit 13-1 to the fifth switch circuit 13-5 via penetration electrodes or non-contact communication coils, respectively. In addition, the control chip 12 is arranged on a portion (for example, the semiconductor substrate unit principal surface 11A1 of the first semiconductor chip 11-1) other than the insulating layer unit principal surface 11B1 of the fifth semiconductor chip 11-5. In addition, the signal terminals may be provided, for example, on a side surface of the semiconductor device 1. In addition, some of the signal terminals may be terminals (for example, non-contact communication coils) that perform communication in a non-contact manner. For example, the signal terminals provided on the side surface of the semiconductor device 1 may be terminals (for example, non-contact communication coils) that perform the communication in a non-contact manner and signal terminals provided on a portion other than the side surface of the semiconductor device 1 may be terminals that perform the communication in a contact manner.

The total thickness of the semiconductor substrate unit 11A and the insulating layer unit 11B is, for example, 2 μm to 25 μm. As such, because each of the semiconductor chips 11 is formed thinly, the thickness of the semiconductor chips 11 is only about 256 μm to 3200 μm even if the semiconductor chips 11 are layered in 128 layers. Therefore, the semiconductor chip 11 facilitates miniaturization and integration of the semiconductor device 1.

The input-side signal line 14 (not shown in the drawings), the output-side signal line 15 (not shown in the drawings), and the non-contact communication coil 16 are formed of copper, aluminum, or the like. Each non-contact communication coil 16 has the same size, for example, 5 μm to 100 μm. Therefore, a large number of non-contact communication coils 16 can be arranged in one semiconductor chip 11. Therefore, the semiconductor chip 11 facilitates the miniaturization and the integration of the semiconductor device 1.

The input-side signal line 14, the output-side signal line 15, and the non-contact communication coil 16 can be formed by known wiring formation technology (wiring formation technology using a damascene method, wiring formation technology using sputtering and etching, or the like). Therefore, a wiring formation process for connection between chips in the following processes can be simplified.

As described above, the non-contact communication coil 16 is arranged to overlap the switch circuit 13, the calculation unit 17, and the memory unit 18 in the layering direction X. Therefore, the first semiconductor chip 11-1 to the fifth semiconductor chip 11-5 communicate with each other via the facing non-contact communication coils 16.

Figure 4:
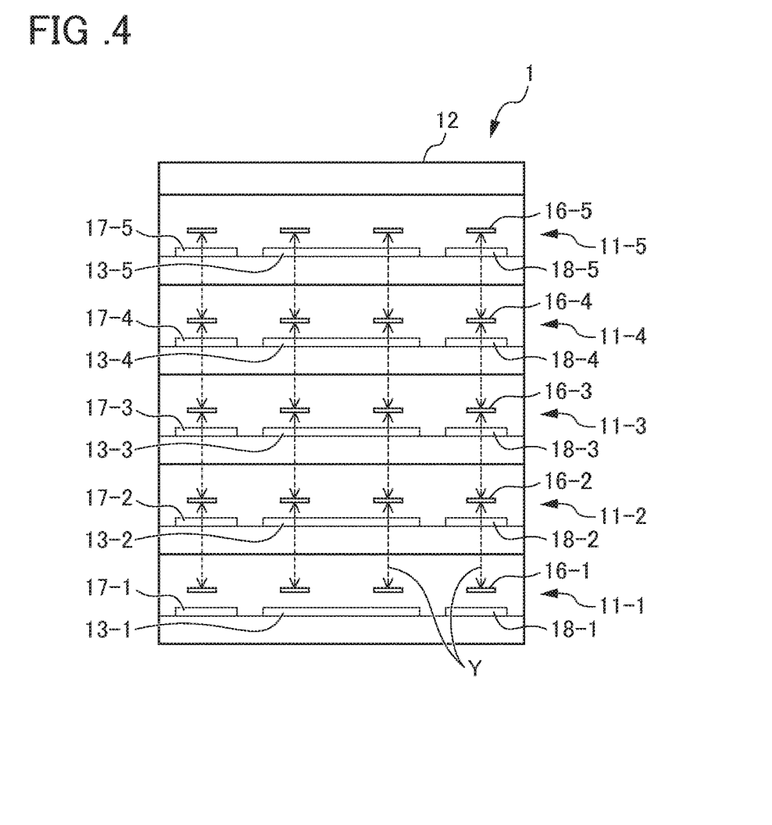
FIG. 4 is a schematic cross-sectional view explaining non-contact communication in the semiconductor device according to the embodiment of the present invention.

As shown by the dotted arrows Y of FIG. 4, at least a part of the communication using the facing non-contact communication coils 16 is performed via the semiconductor substrate unit 11A, the switch circuit 13, the calculation unit 17, the memory unit 18, and the insulating layer unit 11B. Such communication is peculiar to communication using the non-contact communication coils 16 and cannot be realized by TSV.

In the above description, the aspect where the first non-contact communication coil 16-1 to the fifth non-contact communication coil 16-5 are arranged to overlap each other in the layering direction X is described. In this aspect, the non-contact communication coil 16 of each semiconductor chip 11 can communicate with the non-contact communication coils 16 of all the other semiconductor chips 11 in a non-contact manner in the layering direction X.

Figure 5B:
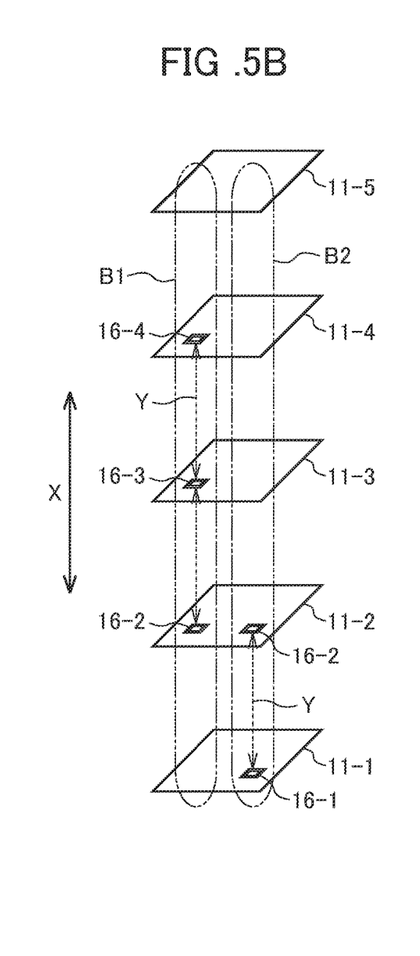
FIG. 5B is a diagram showing an aspect where the non-contact communication is performed between semiconductor chips adjacent to each other in a layering direction.
Figure 5C:
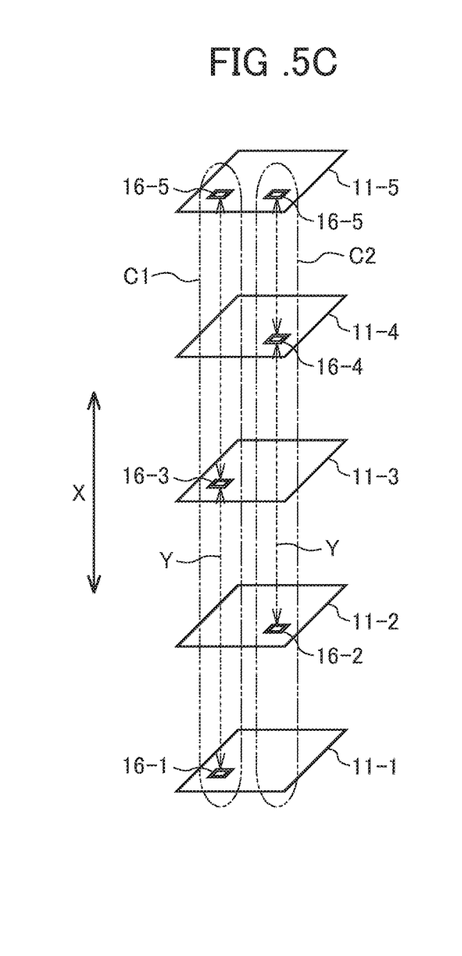
FIG. 5C is a diagram showing an aspect where the non-contact communication is performed between semiconductor chips not adjacent to each other in the layering direction.

However, there are various aspects in the communication of the non-contact communication coils 16. The various aspects will be described with reference to FIGS. 5A to 5C. FIGS. 5A to 5C are exploded perspective views explaining non-contact communication in the semiconductor device according to the embodiment of the present invention. FIG. 5A is a diagram showing an aspect where the non-contact communication is performed between all semiconductor chips. FIG. 5B is a diagram showing an aspect where the non-contact communication is performed between semiconductor chips adjacent to each other in a layering direction. FIG. 5C is a diagram showing an aspect where the non-contact communication is performed between semiconductor chips not adjacent to each other in the layering direction.

As shown in FIG. 5A, the non-contact communication coil 16 of the semiconductor chip 11 can communicate with the non-contact communication coils 16 of all the other semiconductor chips 11 in a non-contact manner. This arrangement is the same arrangement as the arrangement described above. In this arrangement, one of the non-contact communication coils 16 in all of the semiconductor chips 11 is arranged to overlap each other in the layering direction X. The non-contact communication coils 16 in FIG. 5A communicate with the non-contact communication coils, which are the non-contact communication coils 16 of the semiconductor chips 11 adjacent in the layering direction and are overlapped in the layering direction, in a non-contact manner in the layering direction. Such non-contact communication coils 16 may be referred to as adjacent communication non-contact communication coils.

As shown in FIGS. 5B and 5C, the non-contact communication coils 16 of the semiconductor chips 11 can be arranged to communicate with the non-contact communication coils 16 of some other semiconductor chips 11 in a non-contact manner. In this arrangement, in two or more the semiconductor chips 11, at least one non-contact communication coil 16 of the non-contact communication coils 16 is arranged to overlap each other in the layering direction X and is arranged so as not to overlap the non-contact communication coils 16 in other semiconductor chips 11 different from the two or more the semiconductor chips 11.

In the aspect shown in FIG. 5B, the non-contact communication coil 16 of the semiconductor chip 11 can communicate with the non-contact communication coil 16 of another semiconductor chip 11 adjacent in the layering direction X in a non-contact manner. The non-contact communication coils 16 of the semiconductor chips 11 not adjacent to each other cannot communicate with each other in a non-contact manner. The non-contact communication coils 16 of the semiconductor chips 11 adjacent to each other are arranged to overlap each other in regions (B1 and B2) extending in the layering direction X. In addition, the non-contact communication coils 16 of the semiconductor chips 11 not adjacent to each other are not arranged to overlap each other in the regions (B1 and B2) extending in the layering direction X.

For example, in FIG. 5B, the third semiconductor chip 11-3 is adjacent to the second semiconductor chip 11-2 and the fourth semiconductor chip 11-4 in the layering direction X. In addition, the non-contact communication coil 16-3 of the third semiconductor chip 11-3 is arranged to overlap the non-contact communication coil 16-2 of the second semiconductor chip 11-2 and the non-contact communication coil 16-4 of the fourth semiconductor chip 11-4 in a region B1 (two-dotted chain line) extending in the layering direction X. Therefore, the non-contact communication coil 16-3 of the third semiconductor chip 11-3 can communicate with the non-contact communication coil 16-2 of the second semiconductor chip 11-2 and the non-contact communication coil 16-4 of the fourth semiconductor chip 11-4 in a non-contact manner in the layering direction X in the region B1.

On the other hand, the third semiconductor chip 11-3 is not adjacent to the first semiconductor chip 11-1 and the fifth semiconductor chip 11-5. In addition, the first non-contact communication coil 16-1 of the first semiconductor chip 11-1 and the fifth non-contact communication coil 16-5 of the fifth semiconductor chip 11-5 are arranged to overlap the non-contact communication coil 16-3 of the third semiconductor chip 11-3 in the region B1. Therefore, the non-contact communication coil 16-3 of the third semiconductor chip 11-3 cannot communicate with the first non-contact communication coil 16-1 of the first semiconductor chip 11-1 and the fifth non-contact communication coil 16-5 of the fifth semiconductor chip 11-5 in a non-contact manner in the layering direction X in the region B1.

For example, in FIG. 5B, the second semiconductor chip 11-2 is adjacent to the first semiconductor chip 11-1 in the layering direction X. In addition, the second non-contact communication coil 16-2 of the second semiconductor chip 11-2 is arranged to overlap the first non-contact communication coil 16-1 of the first semiconductor chip 11-1 in a region B2 (two-dotted chain line) extending in the layering direction X. Therefore, the second non-contact communication coil 16-2 of the second semiconductor chip 11-2 can communicate with the first non-contact communication coil 16-1 of the first semiconductor chip 11-1 in a non-contact manner in the layering direction X in the region B2.

On the other hand, the second semiconductor chip 11-2 is not adjacent to the fourth semiconductor chip 11-4 and the fifth semiconductor chip 11-5. In addition, the fourth non-contact communication coil 16-4 of the fourth semiconductor chip 11-4 and the fifth non-contact communication coil 16-5 of the fifth semiconductor chip 11-5 are not arranged to overlap the non-contact communication coil 16-2 of the second semiconductor chip 11-2 in the region B2. Therefore, the second non-contact communication coil 16-2 of the second semiconductor chip 11-2 cannot communicate with the fourth non-contact communication coil 16-4 of the fourth semiconductor chip 11-4 and the fifth non-contact communication coil 16-5 of the fifth semiconductor chip 11-5 in a non-contact manner in the layering direction X in the region B2.

The third semiconductor chip 11-3 is adjacent to the second semiconductor chip 11-2. Therefore, the third non-contact communication coil 16-3 of the third semiconductor chip 11-3 may be arranged to overlap the second non-contact communication coil 16-2 of the second semiconductor chip 11-2 in the region B2. However, it may not be arranged as shown in FIG. 5B.

In addition, the non-contact communication coils 16 in FIG. 5B communicate with the non-contact communication coils, which are the non-contact communication coils 16 of the semiconductor chips 11 adjacent in the layering direction and are overlapped in the layering direction, in a non-contact manner in the layering direction. Such non-contact communication coils 16 may be referred to as adjacent communication non-contact communication coils.

In the aspect shown in FIG. 5C, the non-contact communication coil 16 of the semiconductor chip 11 can communicate with the non-contact communication coil 16 of another semiconductor chip 11 not adjacent in the layering direction X in a non-contact manner via another adjacent semiconductor chip 11. The non-contact communication coils 16 of the semiconductor chips 11 adjacent to each other are arranged so as not to be able to communicate with each other in a non-contact manner. The non-contact communication coils 16 of the semiconductor chips 11 not adjacent to each other are arranged to overlap each other in regions (C1 and C2 shown by two-dotted chain lines) extending in the layering direction X. In addition, the non-contact communication coils 16 of the semiconductor chips 11 adjacent to each other are not arranged to overlap each other in the regions (C1 and C2) extending in the layering direction X.

For example, in FIG. 5C, the third semiconductor chip 11-3 is not adjacent to the first semiconductor chip 11-1 and the fifth semiconductor chip 11-5. In addition, the third non-contact communication coil 16-3 of the third semiconductor chip 11-3 is arranged to overlap the first non-contact communication coil 16-1 of the first semiconductor chip 11-1 and the fifth non-contact communication coil 16-5 of the fifth semiconductor chip 11-5 in a region C1 (two-dotted chain line) extending in the layering direction X. Therefore, the third non-contact communication coil 16-3 of the third semiconductor chip 11-3 can communicate with the first non-contact communication coil 16-1 of the first semiconductor chip 11-1 and the fifth non-contact communication coil 16-5 of the fifth semiconductor chip 11-5 in a non-contact manner in the layering direction X in the region C1.

On the other hand, the third semiconductor chip 11-3 is adjacent to the second semiconductor chip 11-2 and the fourth semiconductor chip 11-4 in the layering direction. In addition, the second non-contact communication coil 16-2 of the second semiconductor chip 11-2 and the fourth non-contact communication coil 16-4 of the fourth semiconductor chip 11-4 are not arranged to overlap the third non-contact communication coil 16-3 of the third semiconductor chip 11-3 in the region C1. Therefore, the third non-contact communication coil 16-3 of the third semiconductor chip 11-3 cannot communicate with the second non-contact communication coil 16-2 of the second semiconductor chip 11-2 and the fourth non-contact communication coil 16-4 of the fourth semiconductor chip 11-4 in a non-contact manner in the layering direction X in the region C1.

For example, in FIG. 5C, the fourth semiconductor chip 11-4 is not adjacent to the second semiconductor chip 11-2 in the layering direction. In addition, the fourth non-contact communication coil 16-4 of the fourth semiconductor chip 11-4 is arranged to overlap the second non-contact communication coil 16-2 of the second semiconductor chip 11-2 in a region C2 (two-dotted chain line) extending in the layering direction X. Therefore, the fourth non-contact communication coil 16-4 of the fourth semiconductor chip 11-4 can communicate with the second non-contact communication coil 16-2 of the second semiconductor chip 11-2 in a non-contact manner in the layering direction X in the region C2.

On the other hand, the fourth semiconductor chip 11-4 is adjacent to the third semiconductor chip 11-3. In addition, the fourth non-contact communication coil 16-4 of the fourth semiconductor chip 11-4 is not arranged to overlap the third non-contact communication coil 16-3 of the third semiconductor chip 11-3 in the region C2 extending in the layering direction X. Therefore, the fourth semiconductor chip 11-4 is not arranged to overlap the third non-contact communication coil 16-3 of the third semiconductor chip 11-3 in the region C2. Therefore, the fourth non-contact communication coil 16-4 of the fourth semiconductor chip 11-4 cannot communicate with the third non-contact communication coil 16-3 of the third semiconductor chip 11-3 in a non-contact manner in the layering direction X in the region C2.

The first semiconductor chip 11-1 is not adjacent to the fourth semiconductor chip 11-4. Therefore, the first non-contact communication coil 16-1 of the first semiconductor chip 11-1 may be arranged to overlap the fourth non-contact communication coil 16-4 of the fourth semiconductor chip 11-4 in the region C2. However, it may not be arranged as shown in FIG. 5C. The fifth semiconductor chip 11-5 is adjacent to the fourth semiconductor chip 11-4. Therefore, the fifth non-contact communication coil 16-5 of the fifth semiconductor chip 11-5 may be arranged so as not to overlap the fourth non-contact communication coil 16-4 of the fourth semiconductor chip 11-4 in the region C2. However, it may be arranged as shown in FIG. 5C.

In addition, the non-contact communication coils 16 in FIG. 5C communicate with the non-contact communication coils, which are the non-contact communication coils 16 of the semiconductor chips 11 not adjacent in the layering direction and are overlapped in the layering direction X, in a non-contact manner in the layering direction X. Such non-contact communication coils 16 may be referred to as non-adjacent communication non-contact communication coils.

The second non-contact communication coil 16-2 and the fourth non-contact communication coil 16-4 of FIG. 5B are adjacent communication non-contact communication coils and are also non-adjacent communication non-contact communication coils. The non-contact communication coil 16-4 of FIG. 5C is a non-adjacent communication non-contact communication coil and is also an adjacent communication non-contact communication coil.

As the arrangement of the non-contact communication coils 16, the arrangements shown in FIGS. 5A to 5C may be mixed. That is, the non-contact communication coils 16 in a specific region extending in the layering direction X may communicate with the non-contact communication coils 16 of all the semiconductor chips 11 in the specific region, the non-contact communication coils 16 in another specific region extending in the layering direction X may communicate with only the non-contact communication coils 16 of the adjacent semiconductor chips 11, and the non-contact communication coils 16 in still another specific region extending in the layering direction X may communicate with only the non-contact communication coils 16 of the non-adjacent semiconductor chips 11.

In addition, each of the first non-contact communication coil 16-1 to the fifth non-contact communication coil 16-5 in FIG. 5A has been described as the adjacent communication non-contact communication coil. However, some or all of the first non-contact communication coil 16-1 to the fifth non-contact communication coil 16-5 may be adjacent communication non-contact communication coils and may also be non-adjacent communication non-contact communication coils. For example, the first non-contact communication coil 16-1 may communicate with the second non-contact communication coil 16-2 in a non-contact manner (that is, adjacent communication non-contact communication coil) and may communicate with the third non-contact communication coil 16-3 to the fifth non-contact communication coil 16-5 in a non-contact manner (that is, non-adjacent communication non-contact communication coil).

FIGS. 1 to 5 are diagrams simplified to facilitate understanding of the configuration and the operation of the present invention. The number of semiconductor chips 11 to be layered, the number and the arrangement of switch circuits 13, the number and the arrangement of each of input-side signal lines 14, output-side signal lines 15, and non-contact communication coils 16, the number and the arrangement of each of signal input terminals 20 and signal output terminals 30, and the like can be changed variously and FIGS. 1 to 5 do not limit the present invention.

According to the semiconductor device 1 according to the embodiment that has the configuration described above, the following effects are achieved. The semiconductor device 1 is a semiconductor device that has the plurality of layered semiconductor chips 11 and the control chip 12. Each of the semiconductor chips 11 has the operation unit 17 and the memory unit 18 (the plurality of signal processing units) that can be connected to each other, the plurality of input-side signal lines 14 and the plurality of output-side signal lines 15 (the plurality of in-chip signal lines) that are connected to the operation unit 17 and the memory unit 18 and can be connected to each other, the switch circuit 13 that can change the connection state between the plurality of input-side signal lines 14 and the plurality of output-side signal lines 15 according to an instruction signal R from the control chip 12, and the plurality of non-contact communication coils 16 that are respectively connected to the plurality of input-side signal lines 14 and the plurality of output-side signal lines 15. Each of the non-contact communication coils 16 of each of the semiconductor chips 11 can communicate with the non-contact communication coils 16 of one or more other semiconductor chips 11 in a non-contact manner in the layering direction. The switch circuit 13 of each of the semiconductor chips 11 changes the connection state between the plurality of input-side signal lines 14 and the plurality of output-side signal lines 15 according to the instruction signal R from the control chip 12, so that the connection state between the operation unit 17 and the memory unit 18 is changed.

Therefore, the semiconductor device 1 can realize a semiconductor device with a configuration that facilitates miniaturization and integration.

In addition, one non-contact communication coil 16 (for example, the non-contact communication coil 16 shown in FIG. 5A or 5B) of the semiconductor chip 11 communicates with the non-contact communication coils 16 of the semiconductor chips 11 adjacent in the layering direction and are overlapped in the layering direction, in a non-contact manner in the layering direction.

In addition, one non-contact communication coil 16 (for example, the third non-contact communication coil 16-3 of FIG. 5C) of the semiconductor chip 11 (for example, the third semiconductor chip 11-3 of FIG. 5C) communicates with the non-contact communication coils 16 (for example, the first non-contact communication coil 16-1 and the fifth non-contact communication coil 16-5 of FIG. 5C), which are the non-contact communication coils 16 of the semiconductor chips 11 (for example, the first semiconductor chip 11-1 and the fifth semiconductor chip 11-5 of FIG. 5C) not adjacent in the layering direction and are overlapped in the layering direction, in a non-contact manner in the layering direction X.

In addition, one non-contact communication coil 16 (for example, the third non-contact communication coil 16-3 of FIG. 5C) of the semiconductor chip 11 (for example, the third semiconductor chip 11-3 of FIG. 5C) and the non-contact communication coils 16 (for example, the second non-contact communication coil 16-2 and the fourth non-contact communication coil 16-4 of FIG. 5C) of at least one semiconductor chip 11 (for example, at least one of the second semiconductor chip 11-2 and the fourth semiconductor chip 11-4 of FIG. 5C) adjacent in the layering direction do not overlap each other in the layering direction.

In addition, in the semiconductor chip 11, some non-contact communication coils are arranged to overlap any one of the switch circuit 13, the calculation unit 17, and the memory unit 18 in the layering direction X.

As such, in each semiconductor chip 11, the non-contact communication coils 16 can be arranged in various aspects. Therefore, the semiconductor device 1 can realize a semiconductor device with a configuration that facilitates miniaturization and integration.

The embodiment of the present invention has been described. However, the present invention is not limited to the embodiment and various modifications can be made within a technical scope described in claims.

In this embodiment, the inductive coupling between the coils is used for non-contact signal transmission and reception. However, the present invention is not limited thereto. Magnetic resonance between coils may be used for the non-contact signal transmission and reception. In addition, coils may not be used for the non-contact signal transmission and reception. For example, an optical signal or a sound wave signal may be used.

In addition, in this embodiment, the difference of characteristics of the individual non-contact communication coils 16 is not described. However, the characteristics of the individual non-contact communication coils 16 may be equal to each other or may be different from each other.

For example, the magnetic flux density formed by the adjacent communication non-contact communication coil may be smaller than the magnetic flux density formed by the non-adjacent communication non-contact communication coil. For example, the size of the adjacent communication non-contact communication coil may be smaller than the size of the non-adjacent communication non-contact communication coil. For example, the winding number (for example, the winding number of 2) of the non-adjacent communication non-contact communication coil may be larger than the winding number (for example, the winding number of 1) of the adjacent communication non-contact communication coil. In addition, a material (for example, ferrite, silicon oxide or silicon nitride mixed with ferrite, or the like) having a permeability higher than that of the material of the insulating layer unit 11B may be arranged in the vicinity of the center of the adjacent communication non-contact communication coil and a material having a permeability higher than that of the material of the insulating layer unit 11B may not be arranged in the vicinity of the center of the adjacent communication non-contact communication coil. This is because an output for inductive coupling can be relatively decreased in the adjacent communication non-contact communication coil, whereas it is necessary to relatively increase an output for induction in the non-adjacent communication non-contact communication coil.

In addition, in this embodiment, the case where the non-contact communication coil 16 is always activated has been described. However, the present invention is not limited thereto. A state changing circuit to change the state (active/inactive) of each non-contact communication coil 16 may be connected to each non-contact communication coil 16. The state changing circuit activates the non-contact communication coil 16 to be used and inactivates the non-contact communication coil 16 not to be used. If the state changing circuit activates the non-contact communication coil 16, the non-contact communication coil 16 enters the state where transmission and reception are enabled. If the state changing circuit inactivates the non-contact communication coil 16, the non-contact communication coil 16 enters the state where transmission and reception are disabled. In this embodiment, the switch circuit 13 has been used as the connection-state changing unit. However, the switch circuit 13 and the state changing circuit may be used as the connection-state changing unit. In this case, the control chip 12 controls the switch circuit 13 and the state changing circuit.

In addition, in the aspect of FIG. 5B, the second non-contact communication coil 16-2 to the fourth non-contact communication coil 16-4 in the region B1 may communicate with the first semiconductor chip 11-1 or the fifth semiconductor chip 11-5. For example, at least one of the second semiconductor chip 11-2 to the fourth semiconductor chip 11-4 may communicate with the first semiconductor chip 11-1 or the fifth semiconductor chip 11-5 via the non-contact communication coils of another region connected by the wiring lines. The same is applied to the non-contact communication coils 16 of the region B2 of FIG. 5B and the regions C1 and C2 of FIG. 5C.

In addition, in this embodiment, some of the non-contact communication coils 16 are arranged to overlap the switch circuit 13, the operation unit 17, or the memory unit 18 in the layering direction X. However, the present invention is not limited thereto. All of the non-contact communication coils 16 may be arranged so as not to overlap the switch circuit 13, the operation unit 17, or the memory unit 18.

In addition, in this embodiment, one operation unit 17 and one memory unit 18 are provided for each semiconductor chip 11. However, the present invention is not limited thereto. The number of operation units 17 and the number of memory units 18 may be numbers other than 1. That is, two signal processing units (the operation unit 17 and the memory unit 18) are provided for each semiconductor chip 11. However, three or more signal processing units may be provided.

In addition, in this embodiment, the semiconductor substrate unit 11A is a substrate made of silicon. However, the present invention is not limited thereto. The semiconductor substrate unit may be formed of a semiconductor material (for example, a compound semiconductor such as GaAs) other than silicon.

In addition, in this embodiment, the insulating layer unit 11B is made of silicon oxide. However, the present invention is not limited thereto. The insulating layer unit may be made of an insulating material (for example, silicon nitride or the like) other than silicon oxide and may be formed by layering two or more kinds of insulating material.

In addition, in this embodiment, fusion bonding is used as a bonding method. However, the present invention is not limited thereto. For example, the bonding method may be a method using an adhesive and may be a method of surface activated normal temperature bonding or the like.

In addition, in this embodiment, the semiconductor device 1 is, for example, an MIMD-type multi-core processor. However, the present invention is not limited thereto. The semiconductor device 1 is not limited to a semiconductor element having a specific signal processing function and may be a semiconductor device having a signal processing function such as a logic IC, a CPU, a memory, a DSP, an FPGA, and the like. In this case, the semiconductor device 1 has signal processing units according to the logic IC, the CPU, the memory, the DSP, the FPGA, and the like.

Therefore, in this embodiment, the operation units 17 functioning as the signal processing units are composed of a plurality of processors. However, the present invention is not limited thereto. The operation unit 17 functioning as the signal processing unit may be any element that has a function of processing a signal and is not limited to the processor. In addition, in this embodiment, the memory units 18 functioning as the signal processing units are composed of a plurality of cache memories. However, the present invention is not limited thereto. The memory unit 18 functioning as the signal processing unit may be any element that has a function of processing a signal and is not limited to the cache memory.

In addition, the semiconductor device 1 can be used as an MIMD-type multi-core processor having a cerebral function or a cerebellar function. For example, the cerebrum or the cerebellum is composed of a large number of nerve cells and synaptic connections. For example, the cerebrum is composed of 10 to 20 billion nerve cells and a total of 100 to 200 trillion synaptic connections. When the cerebral function or the cerebellar function is realized by a normal multi-core processor, size may increase extremely due to a restriction of an occupancy area by TSV and the like. However, in the semiconductor device 1 according to the present invention, each semiconductor chip 11 is thin and an occupancy area of each non-contact communication coil 16 may be smaller than that of TSV or the like. Therefore, the semiconductor device 1 according to the present invention can miniaturize the MIMD-type multi-core processor having the cerebral function or the cerebellar function.

When a semiconductor chip using non-contact communication is used just like the semiconductor device 1, the entire system can be miniaturized at once and transmission delay, power consumption, and manufacturing cost can be greatly reduced. When it is thought that each coil used for the non-contact communication unit corresponds to a contact of a crossbar switch, it is possible to form a large number of contacts within a limited volume. For example, if semiconductors each having a thickness of 5 μm and a 10 mm square are layered in 128 layers, 100 million or more contacts can be formed with a thickness of 640 μm.

If multiple connections can be realized by these semiconductor chips, the construction of a computer with a configuration close to a human brain comes into view. Nerve cells (neurons) that are referred to as operation elements of a brain are connected to other nerve cells at about 1000 contacts (synapses) per cell and it is said that 100 trillion to 200 trillion synaptic connections in the entire brain make human intelligence. In existing switch technology, it is impossible to realize such connections. However, if the non-contact communication units are used, the connections may be realized.

For example, the semiconductor device 1, the semiconductor chip, and the like are used, so that a function corresponding to a human cerebellum can be realized. The cerebellum plays a role of realizing smooth movement and posture maintenance on the basis of an input from sensory organs. Therefore, the semiconductor device 1, the semiconductor chip, and the like can be applied to a robot, an assist suit, a drone, and the like. In addition, a MIMD-type many-core processor based on the semiconductor device 1, the semiconductor chip, and the like can also be applied to artificial intelligence.

1: semiconductor device
11: semiconductor chip
11A: semiconductor substrate unit
11A1: semiconductor substrate unit principal surface
11B: insulating layer unit
11B1: insulating layer unit principal surface
11-1: first semiconductor chip
11-2: second semiconductor chip
11-3: third semiconductor chip
11-4: fourth semiconductor chip
11-5: fifth semiconductor chip
12: control chip (control unit)
13: switch circuit (connection-state changing unit)
13-1: first switch circuit (connection-state changing unit)
13-2: second switch circuit (connection-state changing unit)
13-3: third switch circuit (connection-state changing unit)
13-4: fourth switch circuit (connection-state changing unit)
13-5: fifth switch circuit (connection-state changing unit)
14: input-side signal line (in-chip signal line)
14-1: first input-side signal line (in-chip signal line)
14-2: second input-side signal line (in-chip signal line)
14-3: third input-side signal line (in-chip signal line)
14-4: fourth input-side signal line (in-chip signal line)
14-5: fifth input-side signal line (in-chip signal line)
15: output-side signal line (in-chip signal line)
15-1: first output-side signal line (in-chip signal line)
15-2: second output-side signal line (in-chip signal line)
15-3: third output-side signal line (in-chip signal line)
15-4: fourth output-side signal line (in-chip signal line)
15-5: fifth output-side signal line (in-chip signal line)
16: non-contact communication coil (non-contact communication unit)
16-1: first non-contact communication coil (non-contact communication unit)
16-2: second non-contact communication coil (non-contact communication unit)
16-3: third non-contact communication coil (non-contact communication unit)
16-4: fourth non-contact communication coil (non-contact communication unit)

16-5: fifth non-contact communication coil (non-contact communication unit)
17: calculation unit (signal processing unit)
17-1: first calculation unit (signal processing unit)
17-2: second calculation unit (signal processing unit)
17-3: third calculation unit (signal processing unit)
17-4: fourth calculation unit (signal processing unit)
17-5: fifth calculation unit (signal processing unit)
18: memory unit (signal processing unit)
18-1: first memory unit (signal processing unit)
18-2: second memory unit (signal processing unit)
18-3: third memory unit (signal processing unit)
18-4: fourth memory unit (signal processing unit)
18-5: fifth memory unit (signal processing unit)
X: layering direction
R: instruction signal

The invention claimed is:

1. A semiconductor device comprising a plurality of semiconductor chips and a control unit which are layered,
wherein each of the semiconductor chips has:
a plurality of signal processing units that can be connected with each other;
a plurality of in-chip signal lines that are respectively connected to the plurality of signal processing units and that can be connected with each other, wherein the in-chip signal lines have a plurality of input-side signal lines and a plurality of output-side signal lines;
a connection-state changing unit that changes a connection state between the plurality of in-chip signal lines according to an instruction from the control unit, wherein the connection-state changing unit outputs a signal inputted from any one of the input-side signal lines to any one of the output-side signal lines in switchable manner; and
a plurality of non-contact communication units that are respectively connected to the plurality of in-chip signal lines,
wherein each of the non-contact communication units of each of the semiconductor chips communicates with the non-contact communication unit of one or more other semiconductor chips in a non-contact manner in a layering direction, and
wherein the connection-state changing unit of each semiconductor chip changes the connection state between the plurality of in-chip signal lines according to the instruction from the control unit, so that the connection state between the plurality of signal processing units is changed.

2. The semiconductor device according to claim 1, wherein one of the non-contact communication units of any given semiconductor chip communicates, in a non-contact manner in the layering direction, with a non-contact communication unit of another semiconductor chip adjacent in the layering direction, the one of the non-contact communication units of the any given semiconductor chip being disposed to overlap in the layering direction with the non-contact communication unit of the another semiconductor chip.

3. The semiconductor device according to claim 1, wherein one of the non-contact communication units of any given semiconductor chip communicates, in a non-contact manner in the layering direction, with a non-contact communication unit of another semiconductor chip that is not adjacent in the layering direction, the one of the non-contact communication units of the any given semiconductor chip being disposed to overlap in the layering direction with the non-contact communication unit of the another semiconductor chip.

4. The semiconductor device according to claim 3, wherein one of the non-contact communication units of any given semiconductor chip and one of the non-contact communication units of at least another semiconductor chip adjacent in the layering direction do not overlap each other in the layering direction.

5. The semiconductor device according to claim 1, wherein in the semiconductor chip, one of the non-contact communication units are arranged to overlap any one of the connection-state changing unit and the signal processing unit in the layering direction.

6. The semiconductor device according to claim 1, wherein the non-contact communication unit is a coil.

7. The semiconductor device according to claim 1, wherein one of the non-contact communication units of any given semiconductor chip is an adjacent communication non-contact communication coil that communicates, in a non-contact manner in the layering direction, with a non-contact communication unit of another semiconductor chip adjacent in the layering direction, the one of the non-contact communication units of the any given semiconductor chip being disposed to overlap in the layering direction with the non-contact communication unit of the another semiconductor chip,
one of the non-contact communication units of any given semiconductor chip is a non-adjacent communication non-contact communication coil that communicates, in a non-contact manner in the layering direction, with a non-contact communication unit of another semiconductor chip that is not adjacent in the layering direction, the one of the non-contact communication units of the any given semiconductor chip being disposed to overlap in the layering direction with the non-contact communication unit of the another semiconductor chip, and
a magnetic flux density formed by the adjacent communication non-contact communication coil is smaller than the magnetic flux density formed by the non-adjacent communication non-contact communication coil.

8. A semiconductor device comprising a plurality of semiconductor chips and a control unit which are layered,
wherein each of the semiconductor chips has:
a plurality of signal processing units that can be connected with each other;
a plurality of in-chip signal lines that are respectively connected to the plurality of signal processing units and that can be connected with each other;
a connection-state changing unit that changes the connection state between the plurality of in-chip signal lines according to an instruction from the control unit; and
a plurality of non-contact communication units that are respectively connected to the plurality of in-chip signal lines,
wherein each of the non-contact communication units of each of the semiconductor chips communicates with the non-contact communication unit of one or more other semiconductor chips in a non-contact manner in a layering direction, and
wherein the connection-state changing unit of each semiconductor chip changes the connection state between the plurality of in-chip signal lines according to the instruction from the control unit, so that the connection state between the plurality of signal processing units is changed, wherein in the semiconductor chip, one of the non-contact communication units are arranged to overlap any one of the connection-state changing unit and the signal processing unit in the layering direction.

9. A semiconductor device comprising a plurality of semiconductor chips and a control unit which are layered, wherein each of the semiconductor chips has:
- a plurality of signal processing units that can be connected with each other;
- a plurality of in-chip signal lines that are respectively connected to the plurality of signal processing units and that can be connected with each other;
- a connection-state changing unit that changes the connection state between the plurality of in-chip signal lines according to an instruction from the control unit; and
- a plurality of non-contact communication units that are respectively connected to the plurality of in-chip signal lines, wherein each of the non-contact communication units of each of the semiconductor chips communicates with the non-contact communication unit of one or more other semiconductor chips in a non-contact manner in a layering direction, and wherein the connection-state changing unit of each semiconductor chip changes the connection state between the plurality of in-chip signal lines according to the instruction from the control unit, so that the connection state between the plurality of signal processing units is changed, wherein one of the non-contact communication units of any given semiconductor chip is an adjacent communication non-contact communication coil that communicates, in a non-contact manner in the layering direction, with a non-contact communication unit of another semiconductor chip adjacent in the layering direction, the one of the non-contact communication units of the any given semiconductor chip being disposed to overlap in the layering direction with the non-contact communication unit of the another semiconductor chip, one of the non-contact communication units of any given semiconductor chip is a non-adjacent communication non-contact communication coil that communicates, in a non-contact manner in the layering direction, with a non-contact communication unit of another semiconductor chip that is not adjacent in the layering direction, the one of the non-contact communication units of the any given semiconductor chip being disposed to overlap in the layering direction with the non-contact communication unit of the another semiconductor chip, and a magnetic flux density formed by the adjacent communication non-contact communication coil is smaller than the magnetic flux density formed by the non-adjacent communication non-contact communication coil.

* * * * *